United States Patent
Juhl et al.

(10) Patent No.: US 7,538,332 B1
(45) Date of Patent: May 26, 2009

(54) METHOD OF Z-LIFT ELECTROSTATIC NANOLITHOGRAPHY

(75) Inventors: Shane Juhl, Dayton, OH (US); Sergei F. Lyuksyutov, Akron, OH (US); Richard A. Vaia, Beavercreek, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 156 days.

(21) Appl. No.: 11/217,843

(22) Filed: Sep. 1, 2005

Related U.S. Application Data

(60) Provisional application No. 60/606,597, filed on Sep. 2, 2004.

(51) Int. Cl.
*H01J 37/26* (2006.01)
(52) U.S. Cl. .................................. 250/492.2; 250/307
(58) Field of Classification Search .............. 250/492.2, 250/492.22, 307, 306; 73/105; 216/2, 94
See application file for complete search history.

(56) References Cited

U.S. PATENT DOCUMENTS

| | | | |
|---|---|---|---|
| 5,666,190 | A | 9/1997 | Quate et al. |
| 5,729,026 | A | 3/1998 | Mamin et al. |
| 5,808,302 | A | 9/1998 | Binnig et al. |
| 5,856,967 | A | 1/1999 | Mamin et al. |
| 6,249,747 | B1 | 6/2001 | Binnig et al. |
| 6,391,217 | B2 | 5/2002 | Schaffer et al. |
| 7,173,547 | B2 * | 2/2007 | Baechtold et al. ............ 341/118 |
| 7,241,992 | B1 * | 7/2007 | Lyuksyutov et al. ......... 250/307 |

OTHER PUBLICATIONS

Lyuksyutov et al., Copending Patent Application Subject to an Obligation of Common Assignment "Method of Polymer Nanolithography", AFD 654, U.S. Appl. No. 10/817,406, filed Mar. 25, 2004.
Lyuksyutov et al., Copending Patent Application Subject to an Obligation of Common Assignment "Method Of Amplitude Modulated Electrostatic Polymer Nanolithography," AFD 720, U.S. Appl. No. 11/040,299, filed May 20, 2005.
Sergei F. Lyuksyutov et al. "Electrostatic Nanolithography in Polymers Using Atomic Force Microscopy" published online Jun. 22, 2003 by the Nature Publishing Group.

* cited by examiner

*Primary Examiner*—Kiet T Nguyen
(74) *Attorney, Agent, or Firm*—AFMCLO/JAZ; Gina S. Tollefson

(57) ABSTRACT

The method of the present invention utilizes atomic force microscopy techniques (AFM) for the reversible formation of nanoscale polymeric features by localized heating and mechanical deformation, generated through electrostatically mediated interactions across the polymer film between a conductive backplane and the cantilever AFM tip. This technique utilizes a selective lifting/placement of the cantilevered tip in the z direction (perpendicular to the planar surface of the polymer) to produce nanostructures of precise dimensions in contact AFM mode from regions of polymer locally heated by current flow between the cantilever AFM tip and the conductive substrate.

5 Claims, 4 Drawing Sheets

METHOD OF Z-LIFT ELECTROSTATIC NANOLITHOGRAPHY

CROSS REFERENCE TO RELATED APPLICATIONS

The present application is related to and claims priority on prior copending provisional Application No. 60/606,597, filed Sep. 2, 2004, entitled Method of Z-Lift Electrostatic Nanolithography

RIGHTS OF THE GOVERNMENT

The invention described herein may be manufactured and used by or for the Government of the United States for all governmental purposes without the payment of any royalty.

BACKGROUND OF THE INVENTION

The present invention relates generally to nanolithography and specifically to a polymer electrostatic nanolithography method based upon Z-lift electrostatic Atomic Force Microscopy (AFM).

The use of nano and micro-scale structuring of polymers, whether as a sacrificial, pattern-transfer layer or as the active component in a nano-device, is integral to nearly every aspect of future material fabrication. Two general areas of interest are polymer patterning for micro/nanofabrication and ultra dense data storage. It is known that a fundamental limitation for the density of magnetic storage media such as computer floppy disks and the like is the so-called superparamagnetic limit that is related to spin-spin interactions. Ultra compact data storage in thin polymer films is a promising alternative to ferromagnetic storage mediums because polymer data storage overcomes this fundamental limitation, enabling ultra dense storage.

Techniques providing nanoscale patterning and feature formation are key to advances in nanotechnology, and enable the realization of nanodevices including the above ultra-dense memory, single molecule electronics and bio-nano electromechanical systems. The most versatile platform for nano-patterning is based on Scanning Probe Microscopies (SPMs), which provide for single atom placement, local chemical and physical modification (e.g. dip pen lithography), material removal, and reshaping of a substrate. With the recent introduction of massively parallel arrays of over 1024 individually addressable AFM tips, SPM techniques have drastically increased the accessible patterning speed per area, opening potential commercial opportunities and continuing the drive to develop new variations of SPM techniques. Utilizing polymer as a substrate provides the ability to re-shape the surface topology without removing or depositing material, thereby creating possible alternatives to magnetic-based technologies for use in multiple read-write storage media.

Recent nanolithography investigations pursuant to the above have been based on the spatially selective removal or deposition of polymer. While somewhat successful, the prior art techniques are generally slow to perform. These techniques generally require chemical cross-linking, and/or substantial polymer degradation or ablation to effect. This permanently changes the composition and structure of the media itself, rendering it ineffective for repetitive data storage and retrieval applications.

One such recent polymer nanolithography technique is described in U.S. Pat. No. 6,249,747 to Binning et al. The Binning device utilizes a cantilevered tip within an Atomic Force Microscope wherein an electrically conductive tip is a part of the cantilever. In use, an electric current is applied to the electrically conductive cantilever, heating the cantilever and the tip, in turn. The tip, thus heated, is selectively applied to a heat deformable film to create pits. The pits are utilized to convey information by the creation of a coherent structure. While this technique is somewhat effective, it has the disadvantage that a specialized tip is required and the application of current to heat the tip slows the overall lithographic process because the cantilever is large, requiring additional time to cool down. This technique has the additional disadvantages that the size of the structures formed is limited to the diameter of the tip ($\geqq 20$ nm) and that only pits or holes can be patterned within the polymer film.

A need exists therefore for a high speed polymer nanolithography method that facilitates rapid polymer feature creation without polymer degradation, cross-linking or removal. Such a method would enable reliable, high speed feature creation, and additionally provide for a ready erasure process and subsequent re-patterning of the polymer film.

SUMMARY OF THE INVENTION

Accordingly, it is a primary object of the present invention to provide a polymer nanolithography method overcoming the limitations and disadvantages of the prior art.

Another object of the present invention is to provide a polymer nanolithography method using conventional Atomic Force Microscopy (AFM) apparatuses and techniques.

Yet another object of the present invention is to provide a polymer nanolithography method providing rapid creation of features upon a polymer film.

It is still another object of the present invention to provide a polymer nanolithography method providing rapid creation of features without external heating of a polymer film or AFM tip-film contact.

In accordance with the foregoing principles and objects of the invention, a method of reversible formation of nanoscale polymeric features using Atomic Force Microscopy (AFM) and a combination of localized heating and mechanical deformation, is disclosed. The method of the present invention utilizes a selective lifting of the cantelevered AFM tip in the z direction (perpendicular to the planar surface of the polymer) in combination with localized Joule heating within the substrate between the AFM tip and a conductive backplane to produce nanostructures of precise dimensions. More specifically, the nanostructures are created by a mass transport of polymer within an initially uniform, planar film via localized softening of attoliters ($10^2$-$10^5$ nm$^3$) of polymer by Joule heating enabling high data densities upon the surface of the polymer. This localized Joule heating is accomplished by current flow between the cantilever AFM tip and a conductive wafer upon which the layer of polymer is grown or mounted. This current flow between the tip and the conductive wafer imparts a strong electric field within the polymer to form features within the polymer film. Advantageously, the combination of extremely non-uniform electric field gradients to polarize and manipulate the softened polymer and single-step process methodology using conventional AFM equipment, facilitates rapid (less than one microsecond) creation of features without external heating of a polymer film or AFM tip-film contact. Additionally, the method of the present invention does not affect or remove the polymer material itself. The polymer can be readily returned to its pre-patterned state by a simple annealing process. This facilitates unlimited feature creation/erasure patterning cycles, rendering our invention amenable to repetitive processes such as data storage/retrieval applications.

The present invention is achieved by a polymer nanolithography method comprising the steps of: providing an atomic force microscope, providing a conductive cantilever tip within said atomic force microscope, said cantilever tip including a selectively operable feedback loop controller, providing a thin polymer film mounted upon a conductive wafer, installing a thin polymer film within said atomic force microscope, bringing said cantilever tip into proximity with the surface of said polymer, disabling said feedback loop, applying a preselected voltage to said cantilever tip by ramping the voltage from zero to the preselected voltage over a finite time period, positioning said cantilever tip in the z direction with respect to the surface of said polymer film to create features thereon, said positioning including retracting the cantilever tip from the surface of said polymer film for creation of positive features thereon and extending the cantilever tip towards the surface of said polymer for the creation of negative features thereon, said positioning further being effected at a preselected rate, removing the voltage that was applied during said applying step above, enabling said feedback loop, and translating said cantilever tip into a next position.

The height of the nanostructures or features created is controlled via mechanically drawing or depressing the polymer substrate. This is done by controlling the cantilever height (z-lift) with respect to the polymer surface during application of voltage. Structure height formation relies mainly on, and is proportional, to the z-lift magnitude; however, it has been determined that only a narrow range of voltages yields structures for any given film thickness. Since polymer is not removed or cross-linked during structure formation, the features are erasable. The method of the present invention has been successfully demonstrated on polymers, biological objects (viruses) and Self Assembled Monolayers.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 4:
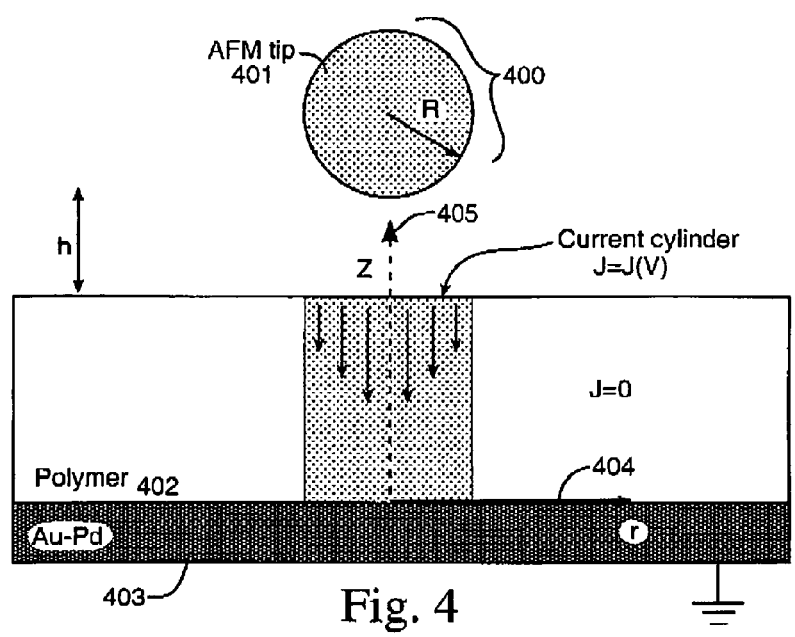
FIG. 4 is a diagrammatic representation of the polymer nanolithography method according to the arrangement of the invention.

The method of the present invention provides for the reversible formation of nanoscale and sub-microscale polymeric features by localized heating and mechanical deformation, generated through electrostatically mediated interactions across the polymer film between a conductive backplane and the AFM tip. This technique utilizes a selective lifting/placement of the cantilevered tip in the z direction (perpendicular to the planar surface of the polymer) to produce nanostructures of precise dimensions in contact AFM mode from regions of polymer locally heated by current flow between the AFM tip and conductive substrate.

The term polymer is used herein according to its ordinary meaning, referring to chain like molecules made up of large numbers of monomers. In common usage the term "polymer" is associated with plastics, but "polymers" can encompass many other types of materials such as biological and inorganic molecules. That is our intention here since the method of the present invention has been successfully demonstrated on disparate types of polymers such as polystyrene, polymethylmethacrylate, as well as DNA and the protein shells of viruses The method of the present invention is related to our nanolithography inventions entitled AFM Electrostatic Nanolithography (AFMEN) described in our copending patent application Ser. Nos. 10/817,406 and 11/040,299, the teachings of which are incorporated by reference herein. Advantageously, AFMEN does not require direct heating of the cantilever as do the systems of the prior art, and is instead based on dielectrophoric manipulation of a local region of polymer that is heated above the glass transition temperature $T_g$. This is accomplished by Joule heating of a thin polymer film between the conductive AFM tip and conductive backplane substrate, to raise the temperature above $T_g$. The resultant electrostatic attraction of the softened polymer toward the tip produces erasable structures that are 10-50 nm in diameter and 1-10 nm in height. It has been determined that feature size does not directly depend on tip diameter since thermal diffusivity within the film and the diameter of the current channel restrict the volume of polymer actually heated above the softening temperature to an area narrower than the tip diameter. This feature size capability represents a significant advantage over the systems of the prior art. Additionally, it has been determined that maintaining a relative humidity level within the atomic force microscope between about 20 at about 80 percent provides the best results.

The present invention is achieved by a polymer nanolithography method comprising the steps of: providing an atomic force microscope 400 and providing a conductive cantilever tip 401 within said atomic force microscope, said cantilever tip including a selectively operable feedback loop controller. The next steps include providing a thin polymer film 402 mounted upon a conductive wafer 403, installing a thin polymer film within said atomic force microscope, bringing said cantilever tip into proximity with the surface of said polymer, disabling said feedback loop, applying a preselected voltage 404 to said cantilever tip by ramping the voltage from zero to the preselected voltage over a finite time period, positioning said cantilever tip in the z direction 405 with respect to the surface of said polymer film to create features thereon, said positioning including retracting the cantilever tip from the surface of said polymer film for creation of positive features thereon and extending the cantilever tip towards the surface of said polymer for the creation of negative features thereon, said positioning further being effected at a preselected rate, removing the voltage that was applied during said applying step above, enabling said feedback loop, and translating said cantilever tip into a next position.

The Z-lift electrostatic nanolithography method of the present invention provides for robust control of the tip-surface distance for specific variable parameters such as bias voltage (0-40 V), initial voltage ramp (0.1-0.2 s), and z-lift rate (0.5-2.0 μm/s) producing variable height nanostructures with a high degree of precision and repeatability. Depending on the magnitude of z-lift, raised, positive or depressed, negative features are formed in the polymer surface. In either case, the tip is not directly heated, distinguishing our invention from prior art systems. Rather, according to our invention, the localized heat is generated through resistive flow of current created within the polymer film.

It is believed that the simultaneous increase of polymer conductivity and local temperature evolves into a soft breakdown and drastic drop of polymer viscosity as the local temperature increases above $T_g$ of the material. Previous results suggest that the speed of our AFMEN process mentioned above is limited by the time required to establish thermal equilibrium in the polymer film and the time required for the polymer to flow towards the AFM tip, which was calculated to occur within 1-3 μs. For z-lift electrostatic nanolithography, it is believed that the rate of structure formation is limited by the rate of cantilever retraction.

Figure 1:
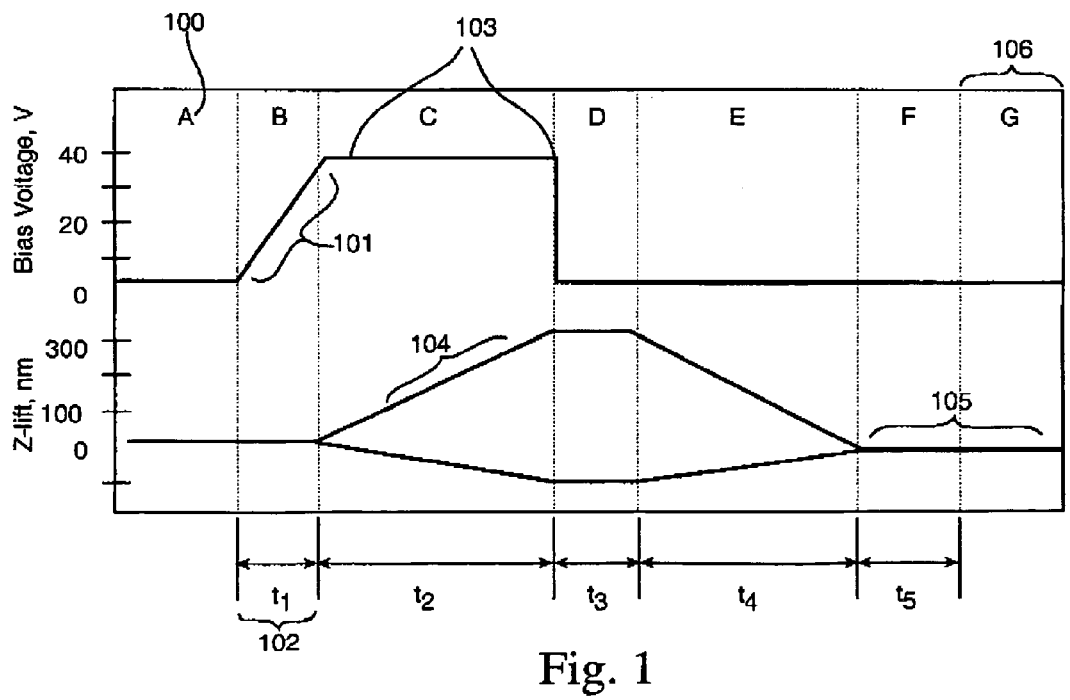
FIG. 1 is a graph illustrating the process steps of the present invention.

Reference is now made to FIG. 1, graphically illustrating the process steps of the present invention. Initially, the conductive AFM tip is brought into proximity with the surface at a deflection set point of 0.2 V and the feedback loop is disabled (A) at 100. Next, the voltage is initially ramped from zero to the dose value (−12 to −40 V) 101 over a finite period (0.00000001 to 0.2 seconds) 102 to insure control over the voltage profile and insure no initial voltage spike (B and C) 103. After the voltage is established, the cantilever is retracted from (0-300 nm) 104 or moved towards (−20-0 nm) the surface at various rates (0.1 microns/sec to 100 millimeters/sec through displacement of the cantilever's piezo-drive (z-lift) with respect to the original reference point determined by set-point voltage (C). Subsequently, the voltage removed (D), the cantilever is returned to the reference pint (E) and allowed to stabilize (F) 105. Finally, the feedback loop is re-engaged (G) 106 and the AFM tip is ready to be translated to the next point on the surface.

Figure 2A:
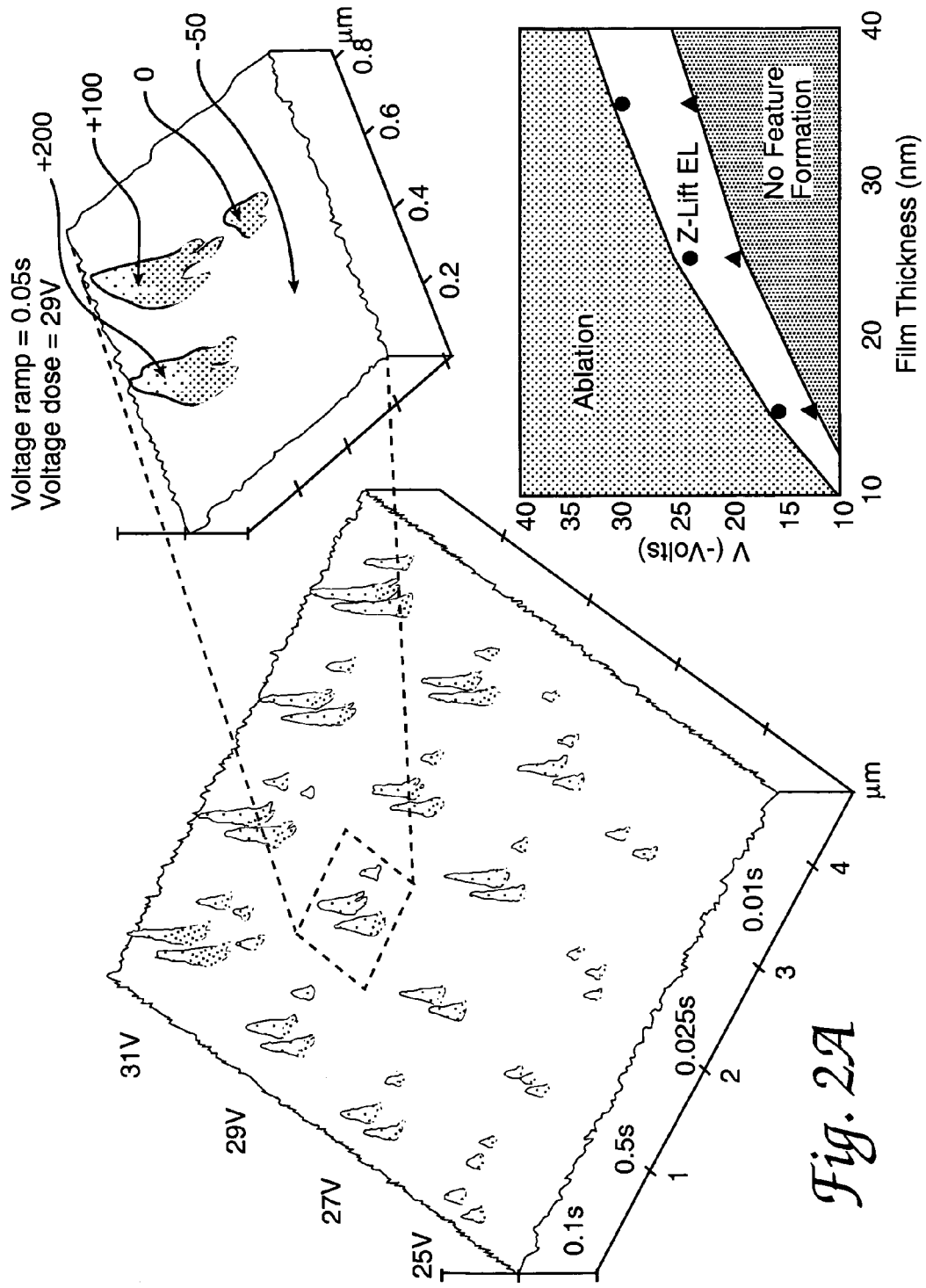
FIG. 2a is a perspective view of the polymer surface diagrammatically showing the feature size generated versus applied voltage and z-lift.
Figure 2B:
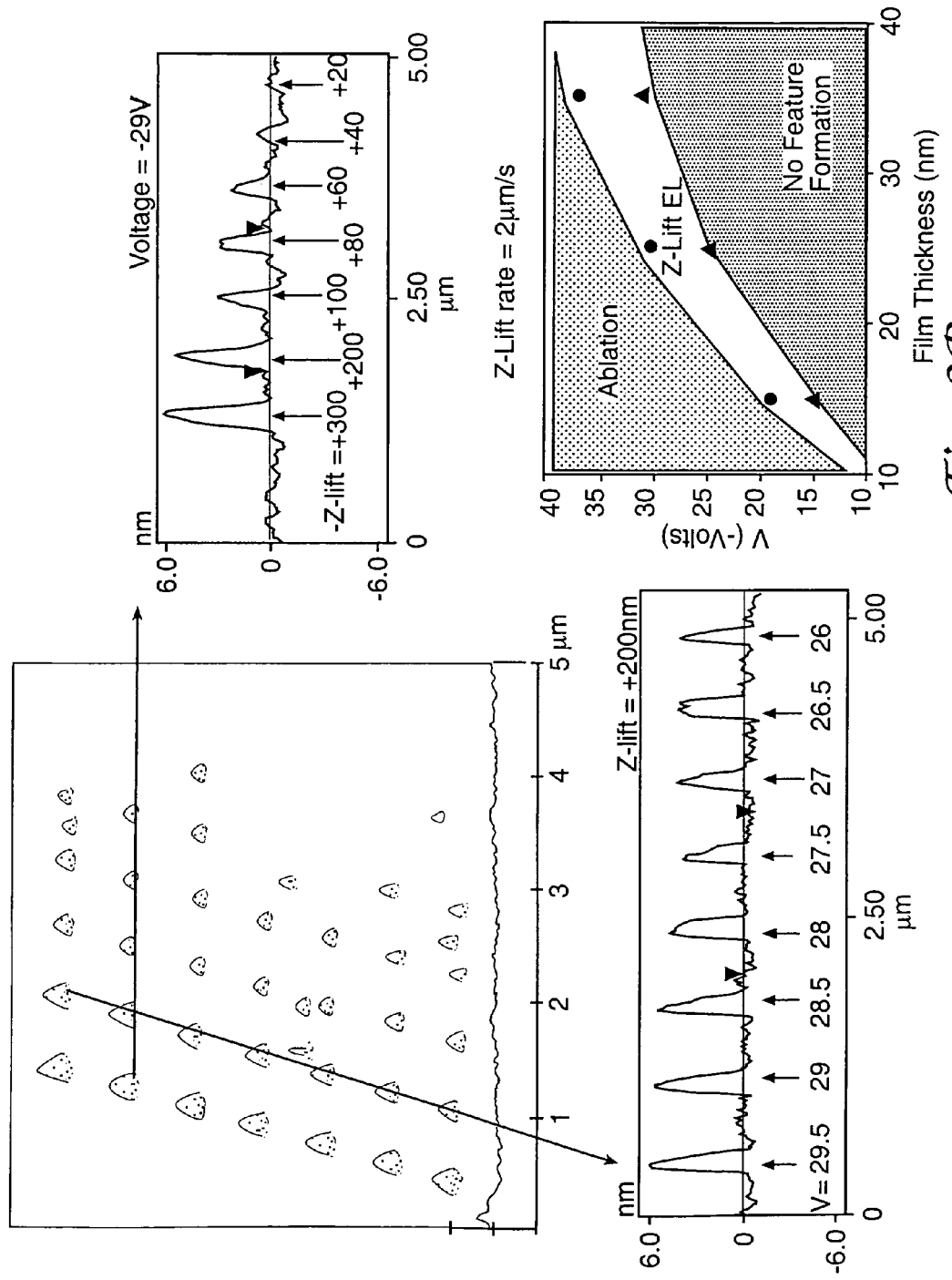
FIG. 2b is another perspective view of the polymer surface diagrammatically showing the feature size generated versus applied voltage and z-lift; and, FIG. 3 is a graph showing the relation between feature height and z-lift for various applied voltages.

The method of the present invention provides robust control of the AFM tip resulting in nanoscopic formation of positive (raised) or negative (depressions or holes) features on the polymer surface. This represents a substantial improvement over the techniques of the prior art since those techniques create only negative features in the polymer. FIGS. 2a and 2b depict the impact of various process parameters on the feature formation during stages B and C on a 40 nm thick polystyrene (PS: $M_w$ 110 k) film on a 100 nm thick Au—Pd sputter coated silicon wafer. As an example of the method of the present invention, a polystyrene, PS film with a uniform thickness gradient was created from a 1% PS solution in toluene using a flow coating process consisting of a 2.5 cm wide steel blade, held at 30° angle from the horizontal and 20 μm from the substrate. The solution was placed on the backside of the blade to form a meniscus between the substrate and the blade. Acceleration of the substrate over a distance of five cm resulted in a pinhole-free, continuous and extremely smooth (surface roughness RMS ~0.3 nm) polymer film with a thickness gradient from 10 nm to 50 nm. Features were generated with a Veeco Dimension 3100 Atomic Force Microscope with a NanoScope IIIa controller in contact mode with a conductive tungsten carbide coated silicon cantilevers from MikroMasch (CSC11/W2C, force constant varied from 0.1 to 0.9 N/m). Current flow during feature generation was 10-100 nA as monitored by a Keithley Instruments Model 6485 Picoammeter.

FIG. 2a illustrates the height and shape of features generated on a 40 nm thick region of the polystyrene (PS) film at different voltages (rows: −25V to −31V) and initial voltage ramp (dose, column: 0.01s to 0.1s) for a constant z-lift rate (0.1 μm/s). Each voltage-dose combination depicts the impact of various z-lifts (−50 nm, 0, +100 nm, +200 nm) resulting in a cluster of four features. Positive z-lift denotes cantilever retraction from the polymer surface, where as negative z-lift denotes cantilever motion towards the surface. For the tip utilized, the snap-off z-lift value determined from deflection-distance curves during the process was between 100 nm (−25V) and 120 nm (−31V). For slightly stiffer or complaint cantilevers, the snap-off distance decreased or increased respectively. This is thought to be the reason for the similar heights for the features corresponding to +100 and +200 nm z-lift. Overall, features are generally asymmetric, comprised of a partial cirque around a valley, which is believed to reflect the growth of the feature on the side of the tip nearest the cantilever. Increasing the rate at which the z-lift is changed (shorter overall dose duration) reduces the noticeable depressions on one side of the dots, greatly speeds the process, and requires only slightly higher voltages. The voltage required for producing features during z-lift increases with film thickness at about 1V/nm. However, increasing the voltage beyond the region for structure formation results in polymer ablation.

Once the voltages required for structure formation are established for a given film thickness, the z-lift has the greatest impact on feature height. For a constant initial voltage ramp of 0.025s, FIG. 2b demonstrates precise manipulation of the feature height at different voltages (row: −25V to −30V) using z-lift control (column: −30 to 300 nm) at 2 μm/s on a 25 nm thick region of the PS film. Note that a more compliant cantilever was used in FIG. 2b relative to the cantilever used to form structures presented in FIG. 2a. This resulted in a greater snap-off distance (400 nm for 30V) and thus the feature height varies over the entire range of z-lifts used (−30 to 300 nm). Advantageously, the structures generated on the polymer film are erasable by heating the substrate in excess of the softening (glass transition) temperature $T_g$ of the film. Surface tension then provides for retraction of the raised features and leveling of the film surface.

Figure 3:
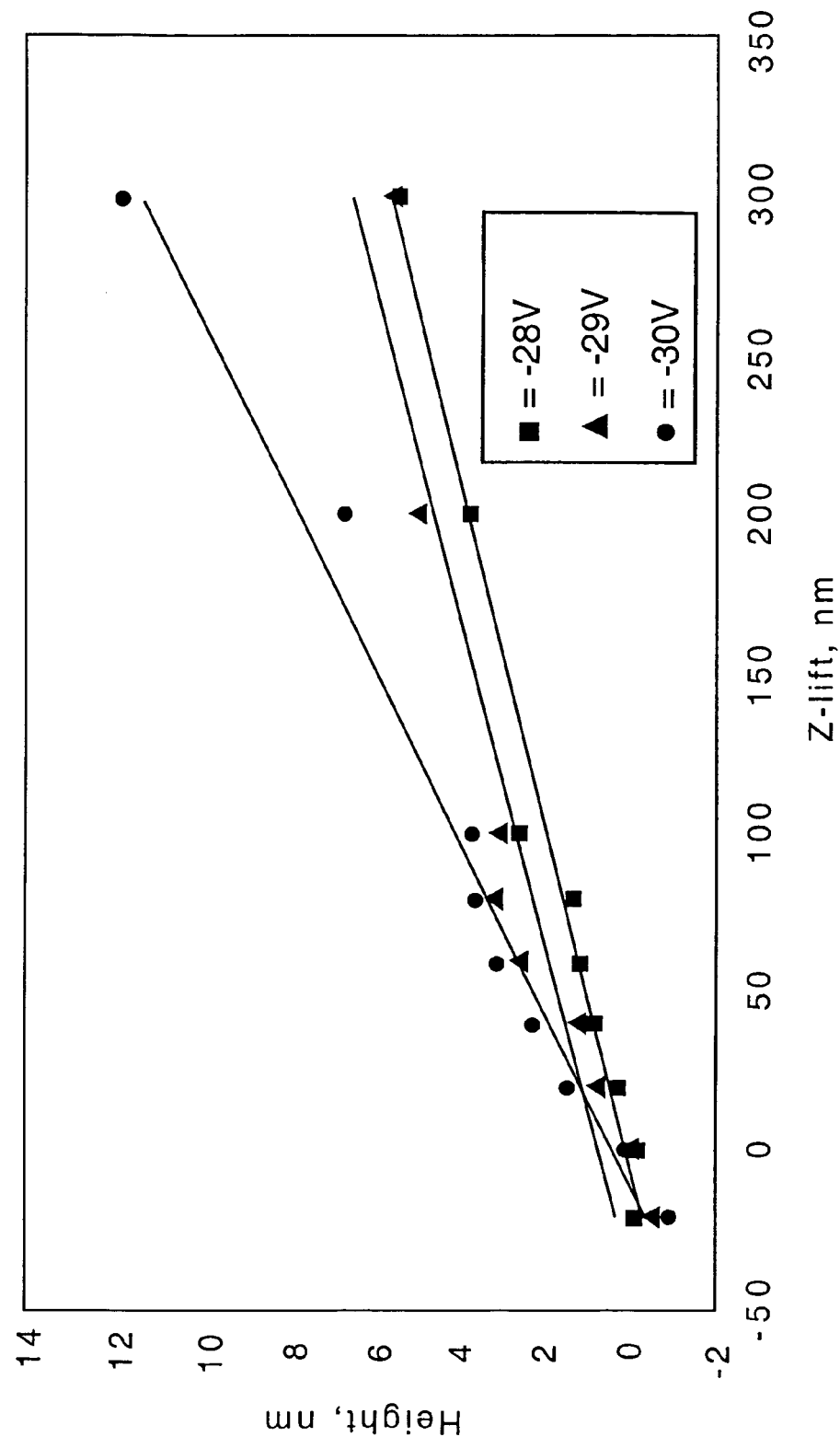

FIG. 3 quantifies the relationship between feature height and magnitude of the z-lift for various voltages on a 25 nm PS film. For constant z-lift values, there is an approximately linear relationship between voltage applied and structure height. Small negative z-lift (0 to −20 nm) either creates very tiny depressions that are not as noticeable or leaves the film apparently unmodified with respect to the 0.3 nm surface roughness. Intensive analysis of the displacement curves suggests that an unbiased AFM tip is slightly deflected from the surface due to the short-range repulsive forces acting at a distance shorter than 1 nm. An electric bias (−20-40 V) attracts molecules of water to the tip, and the field-induced water condensation results in significantly increased size of the meniscus. Since the dielectric constant of the water is around 80, while that of polymer film around 2.4, the interplay of electrostatic forces, together with the contribution from ponderomotive forces results in repulsion of the tip away from the surface, while the AFM cantilever, which is not a subject of water condensation, is electrostatically attracted to the surface. The attractive force between the lever and the surface overcomes tip-polymer repulsion resulting in general attraction of the cantilever-tip system to the surface of polymer film. Z-lift increases tip-surface separation essentially maintaining the geometry in which an AFM lever is bent towards the surface. Eventually, the water meniscus is no longer sustained and the tip snaps off. The quasi-linear relationship of the nanostructure height with respect to z-lift suggests that the amount of raised polymer is proportional the volume of water condensed around the tip.

In summary, numerous benefits have been described from utilizing the principles of the present invention. The present invention utilizes atomic force microscopy techniques (AFM) for the reversible formation of nanoscale polymeric features by localized heating and mechanical deformation, generated through electrostatically mediated interactions across the polymer film between a conductive backplane and the cantilever AFM tip.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

The invention claimed is:

1. A polymer nanolithography method, comprising the steps of:
    providing an atomic force microscope;
    providing a conductive cantilever tip within said atomic force microscope, said cantilever tip including a selectively operable feedback loop controller;
    providing a thin polymer film mounted upon a conductive wafer;
    installing said thin polymer film within said atomic force microscope;
    bringing said cantilever tip into proximity with the surface of said polymer;
    disabling said feedback loop;
    applying a preselected voltage to said cantilever tip by ramping the voltage from zero to the preselected voltage over a finite time period;
    positioning said cantilever tip in the z direction with respect to the surface of said polymer film to create features thereon, said positioning including retracting the cantilever tip from the surface of said polymer film for creation of positive features thereon and extending the cantilever tip towards the surface of said polymer for the creation of negative features thereon, said positioning further being effected at a preselected rate;
    removing the voltage that was applied during said applying step above;
    enabling said feedback loop; and,
    translating said cantilever tip into a next position.

2. The method of claim 1 wherein said installing step is preceded by a step of establishing a preselected relative humidity within said atomic force microscope in the range of about 20-80 percent.

3. The method of claim 1 wherein said preselected voltage is in the range of about 0-40 Volts.

4. The method of claim 1 wherein said finite time period is in the range of about 0.00000001 seconds-0.2 seconds.

5. The method of claim 1 wherein said preselected rate is in the range of about 0.1 microns/second to 100 millimeters/second.

* * * * *